US012794265B2

(12) United States Patent
Lee et al.

(10) Patent No.: US 12,794,265 B2
(45) Date of Patent: Nov. 10, 2026

(54) LIGHT-BASED SOUND GENERATION AND SOUND HARVESTING SYSTEM

(71) Applicant: Toyota Motor Engineering & Manufacturing North America, inc., Plano, TX (US)

(72) Inventors: Taehwa Lee, Ann Arbor, MI (US); Timothy S. Arthur, Ann Arbor, MI (US); Jae Seung Lee, Ann Arbor, MI (US); Danil V. Prokhorov, Canton, MI (US)

(73) Assignees: Toyota Motor Engineering & Manufacturing North America, Inc., Plano, TX (US); Toyota Jidosha Kabushiki Kaisha, Toyota (JP)

( * ) Notice: Subject to any disclaimer, the term of this patent is extended or adjusted under 35 U.S.C. 154(b) by 921 days.

(21) Appl. No.: 18/112,767

(22) Filed: Feb. 22, 2023

(65) Prior Publication Data

US 2024/0283289 A1 Aug. 22, 2024

(51) Int. Cl.

| | |
|---|---|
| ***H10N 30/30*** | (2023.01) |
| ***G10K 11/02*** | (2006.01) |
| ***H02J 50/00*** | (2016.01) |
| ***H02J 50/30*** | (2016.01) |

(52) U.S. Cl.

CPC ............ *H02J 50/001* (2020.01); *G10K 11/02* (2013.01); *H02J 50/30* (2016.02); *H10N 30/302* (2023.02)

(58) Field of Classification Search

CPC ..... H10N 30/302; H10N 30/30; H10N 30/306

See application file for complete search history.

(56) References Cited

U.S. PATENT DOCUMENTS

| | | | | |
|---|---|---|---|---|
| 2010/0317978 | A1* | 12/2010 | Maile | A61B 5/0031 600/300 |
| 2015/0316511 | A1* | 11/2015 | Guo | H04B 10/27 398/140 |
| 2019/0356173 | A1* | 11/2019 | Forster | H02J 50/20 |
| 2021/0267696 | A1* | 9/2021 | Degertekin | A61B 34/20 |
| 2022/0069620 | A1* | 3/2022 | Su | A61B 5/6803 |
| 2022/0221315 | A1* | 7/2022 | Andoh | G08C 19/00 |
| 2022/0238790 | A1* | 7/2022 | Rotzoll | H10N 30/306 |

OTHER PUBLICATIONS

Erika Svanstrom. "Analytical Photoacoustic Model of Laser-Induced Ultrasound in a Planar Layered Structure." Universitetstryckeriet, Lulea (2013).

T. Dehoux et al. "Probing Single-Cell Mechanics with Picosecond Ultrasonics." Ultrasonics 4877 (2014).

T. Lee et al. Out-coupling of Longitudinal Photoacoustic Pulses by Mitigating the Phase Cancellation. https://cyberleninka.org/article/n/687857.pdf.

C. Kopp et al. "Photoacoustic depth profiling of layered samples." Analyst 123, No. 4 (1998): 547-550. http://lib3.dss.go.th/fulltext/Journal/analyst/Analyst1998/no.4/1998v123n4p547-550.pdf.

* cited by examiner

*Primary Examiner* — Bryan P Gordon

(74) *Attorney, Agent, or Firm* — Christopher G. Darrow; Darrow Mustafa PC

(57) ABSTRACT

A light-based sound generation and sound harvesting system may include a light source configured to output a modulated light signal at a frequency and an absorber layer positioned to receive the modulated light signal. The absorber layer is substantially non-transparent and configured to output a sound wave having a substantially similar frequency to the frequency of the modulated light signal when receiving the modulated light signal.

20 Claims, 5 Drawing Sheets

LIGHT-BASED SOUND GENERATION AND SOUND HARVESTING SYSTEM

TECHNICAL FIELD

The subject matter described herein relates, in general, to systems for light-based sound generation and sound harvesting.

BACKGROUND

The background description provided is to present the context of the disclosure generally. Work of the inventor, to the extent it may be described in this background section, and aspects of the description that may not otherwise qualify as prior art at the time of filing, are neither expressly nor impliedly admitted as prior art against the present technology.

Some electronic devices that are generally inaccessible, such as implanted medical devices, must be powered to operate properly. In some cases, batteries are implanted along with the electronic devices that provide power to the electronic device. When the charge level of these batteries becomes low, they must be replaced, usually through another surgical procedure.

To avoid another surgical procedure, different ways of recharging a battery without performing a surgical procedure have been developed. For example, inductive charging, which uses electromagnetic induction to provide electricity, has been utilized to charge implanted electronic devices. However, the magnetic fields utilized to inductively charge a battery can potentially interfere with the operation of the electronic device. In more recent developments, the use of piezoelectric materials, which generate an electrical charge in response to a mechanical movement, have been utilized to recharge implanted electronic devices. However, these devices require some form of mechanical movement, which may not be available.

SUMMARY

This section generally summarizes the disclosure and is not a comprehensive explanation of its full scope or all its features.

In one embodiment, a light-based sound generation system includes a light source configured to output a modulated light signal at a frequency and an absorber layer positioned to receive the modulated light signal. The absorber layer is substantially non-transparent and configured to output a sound wave having a substantially similar frequency to the frequency of the modulated light signal when receiving the modulated light signal.

In another embodiment, a light-based sound generation and sound harvesting system includes a light source configured to output a modulated light signal at a frequency and an absorber layer positioned to receive the modulated light signal. Like before, the absorber layer is substantially non-transparent and configured to output a sound wave with a substantially similar frequency to the frequency of the modulated light signal when receiving the modulated light signal. In addition, the system includes an impedance-matching layer disposed on the absorber layer between the light source and the absorber layer and an energy harvester configured to receive the sound wave output by the absorber layer when the absorber layer receives the modulated light signal.

In yet another embodiment, a light-based sound generation and sound harvesting system includes a light source configured to output a modulated light signal at a frequency and an absorber layer positioned to receive the modulated light signal, the absorber layer being substantially non-transparent and configured to output a sound wave having a substantially similar frequency as the frequency of the modulated light signal when receiving the modulated light signal. Again, the absorber layer is substantially non-transparent and configured to output a sound wave with a substantially similar frequency to the frequency of the modulated light signal when receiving the modulated light signal. The system also includes an energy harvester configured to receive the sound wave output by the absorber layer when the absorber layer receives the modulated light signal. The energy harvester may be configured to be implanted within a mammal and configured to be electrically connected to a medical device implanted within the mammal.

Further areas of applicability and various methods of enhancing the disclosed technology will become apparent from the description provided. The description and specific examples in this summary are intended for illustration only and are not intended to limit the scope of the present disclosure.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

As mentioned in the background section, some devices, such as implanted medical devices, must be replaced or recharged periodically. Because of the difficulty in accessing the implanted medical devices, replacing recharging batteries can be cumbersome. Sound waves can travel through various mediums, such as gases, liquids, solids, and the like, as they propagate away from the source of the sound. As such, sound waves can penetrate through mediums, including human tissue, such as human skin and other internal organs.

In one example, a light-based sound generation and sound harvesting system includes a light source that outputs a modulated light and an absorber layer positioned to receive the modulated light. Upon receiving the modulated light, the absorber layer generates sound waves through a photoacoustic effect. These generated sound waves can then be directed through a medium, such as human tissue, towards an energy harvester that can receive the sound wave and convert the received sound waves to a current, which can then be used to charge an energy storage device, such as a battery. As such, the light-based sound generation and sound harvesting system can be used to charge the batteries of remote devices, such as implanted medical devices, without the need for a surgical procedure or inductive charging.

Figure 1:
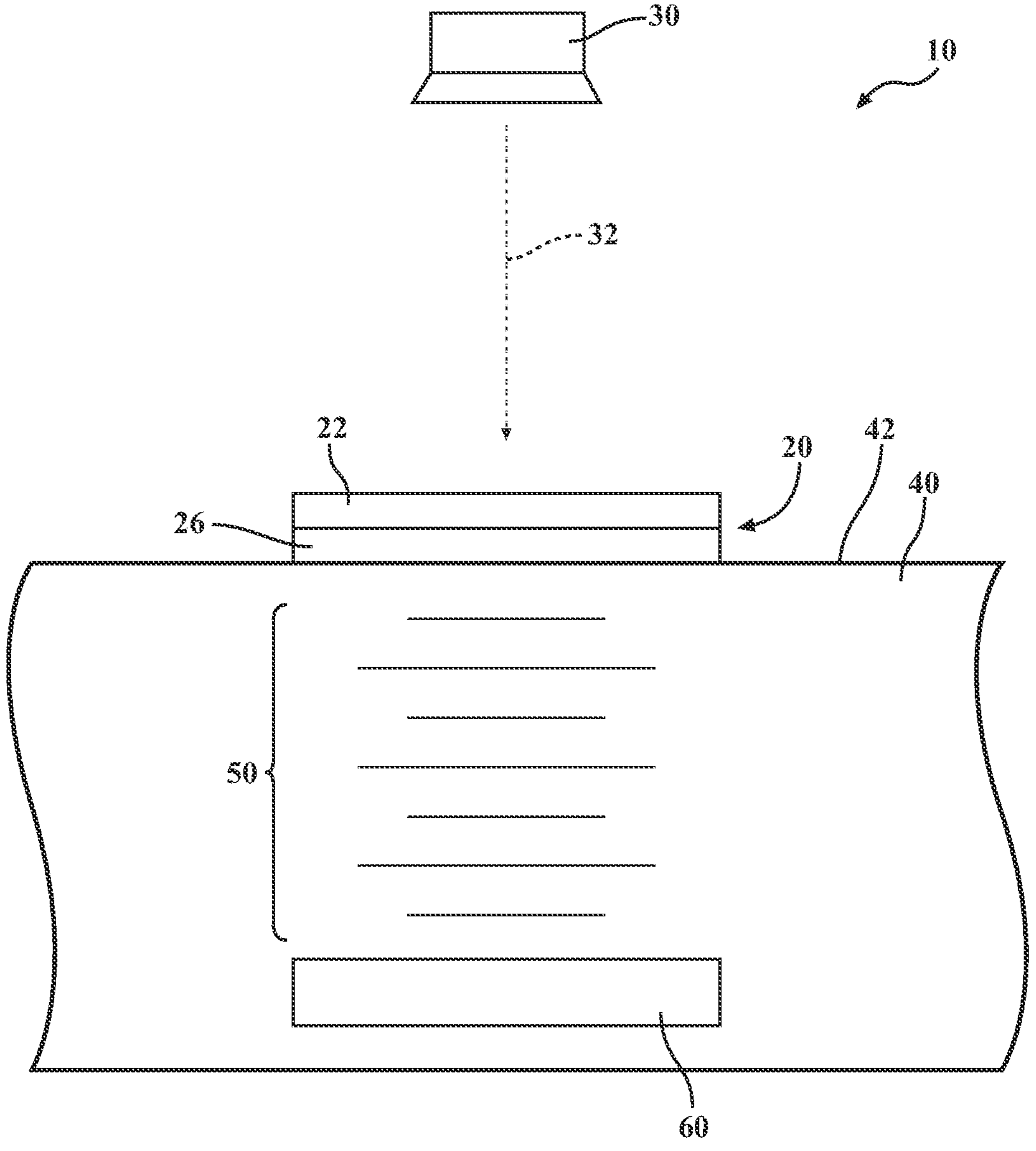
FIG. 1 illustrates an example of a light-based sound generation and sound harvesting system.

Referring to FIG. 1, illustrated is one example of a light-based sound generation and sound harvesting system 10. In this example, the light-based sound generation and sound harvesting system 10 includes sound generation layer(s) 20, a light source 30, and an energy harvester 60. As will be explained in greater detail, the sound generation layer(s) 20 produces sound waves when receiving a modulated light from the light source 30. The sound waves are directed towards the energy harvester 60, which can then convert the sound waves to energy that can be used to charge an energy storage device, such as a battery.

The light source 30 can be any type of suitable light source, such as one or more light-emitting diodes (LEDs). Generally, the light source 30 produces a modulated light 32 at one or more frequencies. Moreover, the amplitude (and therefore the intensity), phase, frequency, or polarization of the radiated oscillations of the modulated light 32 is changed. The light source 30 may produce the modulated light 32 using any appropriate manner. For example, regarding intensity modulation, the light source 30 may vary the amplitude of the modulated light 32 to change its intensity or brightness. This may be achieved using an electronic device, such as an intensity modulator, which an electrical signal can control. Additionally or alternatively, other methodologies for modulating light can also be utilized, such as using a single slit, double slit, or multi-slit diffraction grating. In addition to intensity modulation, other types of modulation, such as phase, polarization, wavelength, and/or amplitude, can also be considered.

Generally, the sound generation layer(s) 20 are positioned to receive the modulated light 32. As will be explained later, the sound generation layer(s) 20 may include both an impedance-matching layer 22 and an absorber layer 26 or may include just the absorber layer 26. Generally, the thickness and/or other material properties of the absorber layer 26 play a role in determining if impedance-matching layer 22 should be utilized.

The sound generation layer(s) 20 may be placed on a top surface 42 of a medium 40. The medium 40 can be any type of medium, such as a liquid or a solid. Alternatively, instead of placing the sound generation layer(s) 20 on the top surface 42 of the medium 40, the sound generation layer(s) 20 can be placed within the medium 40 itself, such as below the top surface 42. However, the modulated light 32 should be able to be received by the sound generation layer(s) 20. For example, if the medium 40 is fairly transparent, such as water, the sound generation layer(s) 20 can be located below the top surface 42 of the medium 40. If the medium 40 is opaque, such as paint, the sound generation layer(s) 20 should be located on the top surface 42.

Upon receiving the modulated light 32, the sound generation layer(s) 20 are configured to produce sound waves 50. In some cases, the sound waves 50 are generated through the photoacoustic effect. The photoacoustic effect occurs when the sound generation layer(s) 20 absorbs the modulated light 32 and converts the modulated light 32 into heat. The conversion of the modulated light 32 to heat causes the sound generation layer(s) 20 to expand. This expansion results in the production of the sound waves 50. Generally, the frequency of the modulated light 32 is substantially similar to the frequency of the sound waves 50 generated by the sound generation layer(s) 20.

The energy harvester 60 is positioned to receive the sound waves 50 from the sound generation layer(s) 20. Generally, the energy harvester 60 may be located within the medium 40. Upon receiving sound waves 50, the energy harvester 60 can convert the sound waves into electrical energy, which can then be stored in a battery or other energy storage device. As will be explained in greater detail later, the energy harvester 60 may include one or more piezoelectric devices that generate an electrical current when mechanically actuated. The sound waves 50 mechanically act upon the one or more piezoelectric devices, causing them to generate a current that can be stored as energy in a battery or other energy storage device.

Figure 2A:
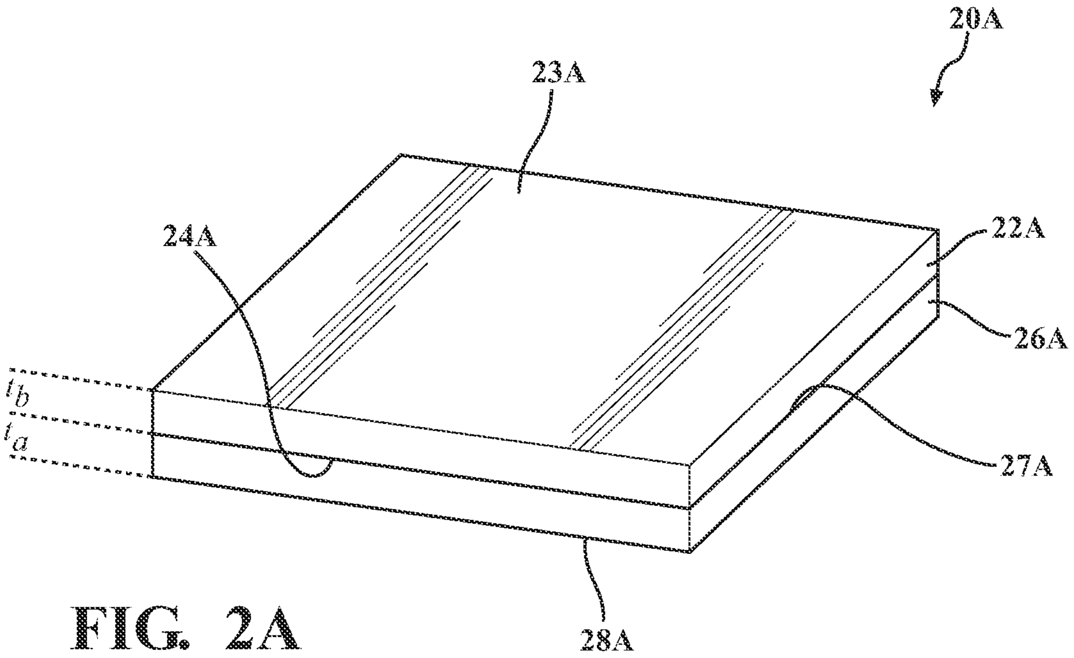
FIG. 2A illustrates examples of an absorber layer and an impedance-matching layer that may be utilized with the light-based sound generation and sound harvesting system of FIG. 1.

As mentioned before, the sound generation layer(s) 20 may include a single absorber layer 26 or may include an additional impedance-matching layer 22. Referring to FIG. 2A illustrated is an example of sound generation layers 20A that includes both an absorber layer 26A and an impedance-matching layer 22A. Regarding the absorber layer 26A, the absorber layer 26A may be substantially non-transparent and, in one example, may be completely opaque. In one example, the absorber layer 26A may be made from polydimethylsiloxane (PDMS). Generally, PDMS is substantially transparent. To make the absorber layer 26A substantially non-transparent, a dye (pigment) may be mixed into the PDMS during the formation of the absorber layer 26A.

Generally, the absorber layer 26A has both a top side 27A that substantially faces the light source 30 of FIG. 1 and a bottom side 28A that substantially faces towards the energy harvester 60 of FIG. 1. The absorber layer 26A can take any one of a number of different shapes. In this example, the top side 27A and the bottom side 28A are rectangular. However, other shapes can also be considered. For example, the top and bottom sides 27A and 28A may be circular, oval, hexagonal, and so forth.

The thickness $t_a$ of the absorber layer 26A can vary from application to application. Generally, the thickness of the absorber layer 26A should be such that when the absorber layer 26A and the impedance-matching layer 22A are exposed to the modulated light 32 from the light source 30, the absorber layer 26A and the impedance-matching layer 22A will produce the sound waves 50.

Figure 4:
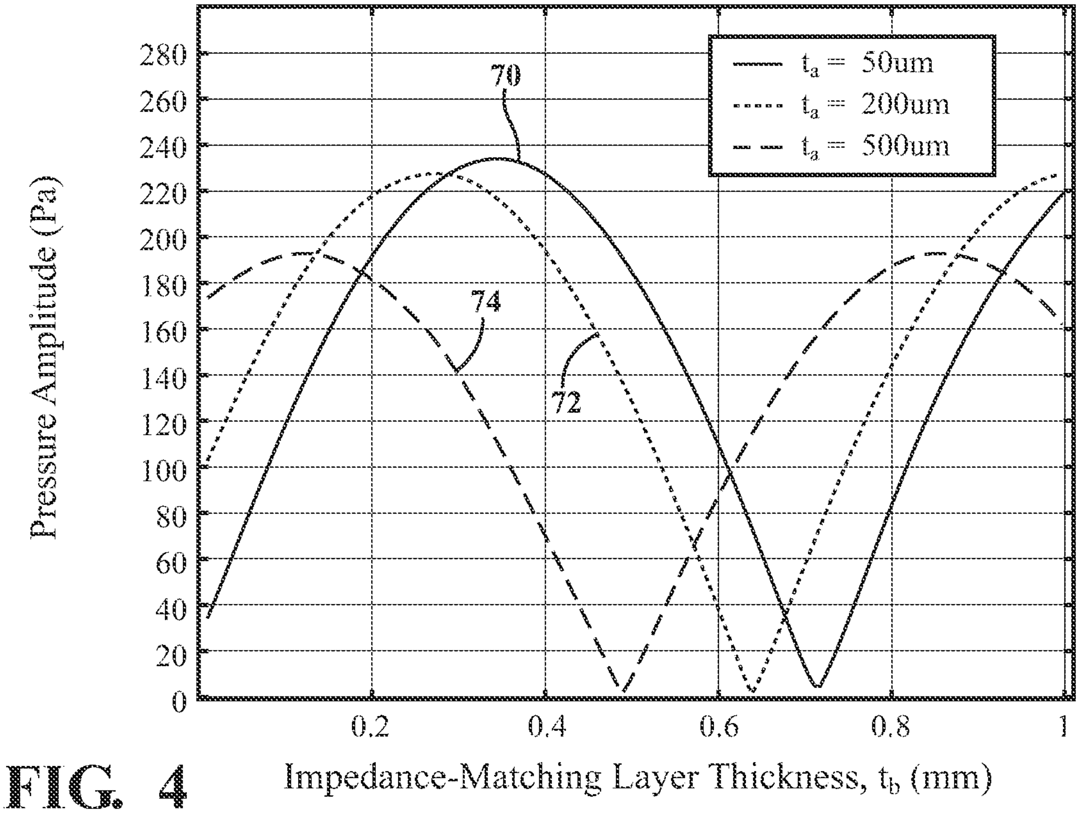
FIG. 4 illustrates the relationship between the thickness of an absorber layer with the thickness of an impedance-matching layer.

FIG. 4 illustrates different thicknesses $t_a$ of the absorber layer 26A and their relation to different thicknesses $t_b$ of the impedance-matching layer 22A. In these examples, the absorber layer 26A and the impedance-matching layer 22A are both made of PDMS. Generally, as the thickness $t_a$ decreases, there is a greater need for the impedance-matching layer 22A. For example, when $t_a$ is 50 μm, the pressure amplitude of the sound wave 50 can be maximized using an impedance-matching layer 22A having approximately 0.4 mm thickness, as indicated by line 70. As the thickness $t_a$ increases, as indicated by lines 72 and 74, a thinner impedance-matching layer 22A can be utilized. As such, as indicated by line 72, the pressure amplitude of the sound wave 50 can be maximized using an impedance-matching layer 22A having approximately 0.2 mm thickness when $t_b$ is 200 μm. Further still, as indicated by line 74, the pressure amplitude of the sound wave 50 can be maximized using an impedance-matching layer 22A having approximately 0.1 mm thickness when $t_b$ is 500 μm.

Returning to FIG. 2A, the impedance-matching layer 22A may have a similar size and shape as the absorber layer 26A. Like the absorber layer 26A, the impedance-matching layer 22A may include a top side 23A that generally faces the light source 30 of FIG. 1 and a bottom side 24A that generally faces towards the absorber layer 26A and the energy harvester 60. Again, like the absorber layer 26A, the impedance-matching layer 22A can take any one of a number of different shapes. In this example, the top side 23A and the bottom side 24A are rectangular. However, other shapes can also be considered. For example, the top and bottom sides 23A and 23A may be circular, oval, hexagonal, and so forth.

The impedance-matching layer 22A may be constructed of a different material or may be constructed of the same material as the absorber layer 26A. For example, the impedance-matching layer 22A may also be made of PDMS. However, unlike the absorber layer 26A, the impedance-matching layer 22A is generally substantially transparent. As such, if the impedance-matching layer 22A is made of PDMS, no dye (pigment) is added to the PDMS, allowing the impedance-matching layer 22A to be substantially transparent. The impedance-matching layer 22A and the absorber layer 26A may be disposed directly adjacent to one another. In this example, the bottom side 24A of the impedance-matching layer 22A is in direct contact with the top side 27A of the absorber layer 26A.

Generally, the impedance-matching layer 22A and the absorber layer 26A have the same acoustic impedance. By having the impedance-matching layer 22A and the absorber layer 26A have substantially similar acoustic impedances, sound scattering between the impedance-matching layer 22A and the absorber layer 26A can be minimized when exposed to the modulated light 32 from the light source 30.

Figure 3:
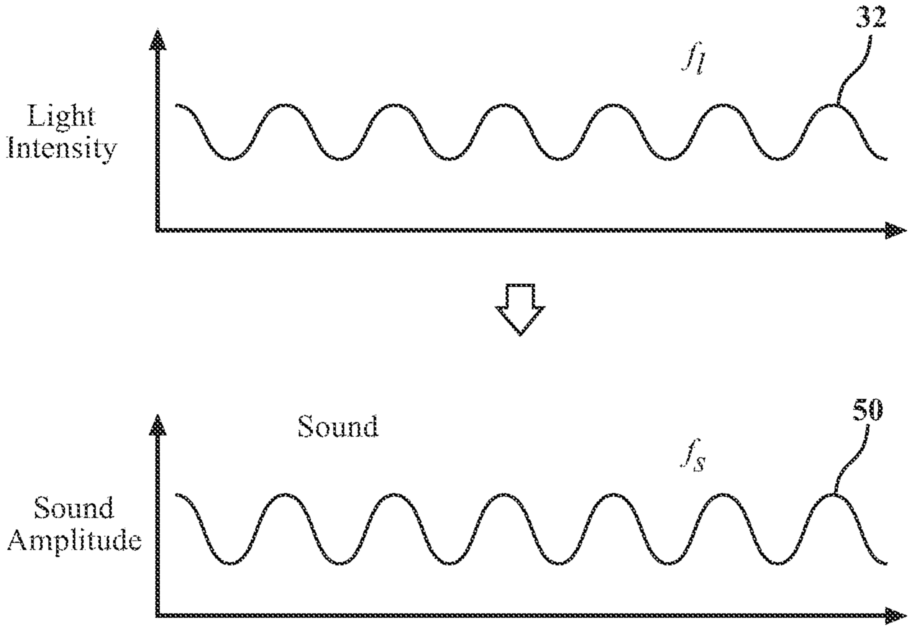
FIG. 3 illustrates that the frequency of light waves utilized to generate sound waves is substantially similar to the frequency of the generated sound waves.

As explained earlier, upon exposure to modulated light 32, the impedance-matching layer 22A and the absorber layer 26A, via the photoacoustic effect, produce the sound waves 50. As best shown in FIG. 3, the frequency of the light intensity of the modulated light 32 is substantially similar to the frequency of the sound intensity of the sound waves 50.

Figure 2B:
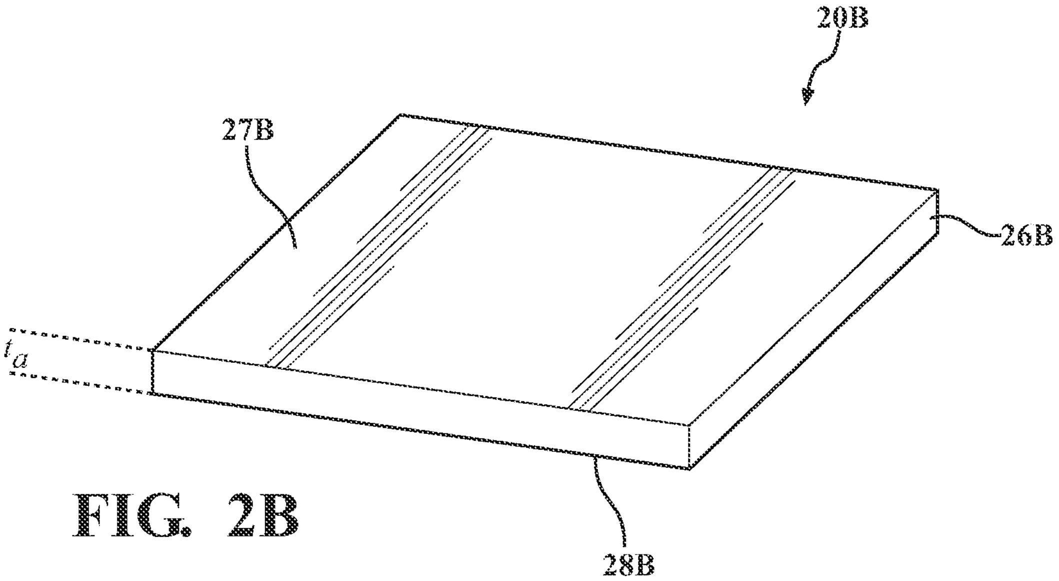
FIG. 2B illustrates an example of an absorber layer that may be utilized with the light-based sound generation and sound harvesting system of FIG. 1.

Referring back to FIG. 4, as mentioned before, the thickness ta of the absorber layer 26A can impact the thickness tb of the impedance-matching layer 22A. In some cases, such as when the absorber layer 26A is relatively thicker, such as when ta is 500 μm, it is possible to forgo the use of the impedance-matching layer 22A altogether. For example, when the thickness of the impedance-matching layer 22A is zero (indicating no impedance-matching layer 22A), the absorber layer 26A can still produce a sound wave 50 having an effective pressure amplitude. The example shown in FIG. 2B illustrates a situation wherein only a single absorber layer 26B is utilized to make up the sound generation layer 20B. Again, this is possible when the thickness of the absorber layer 26B is such that it allows the production of the sound waves 50 having an appropriate pressure amplitude, as indicated in FIG. 4.

The absorber layer 26B may be substantially similar to the absorber layer 26A and any description regarding the absorber layer 26A is equally applicable to the absorber layer 26B. As such, the absorber layer may be made of PDMS or any other suitable material and take any one of a variety of different shapes. Like the absorber layer 26A, the absorber layer 26B includes a top side 27B that generally faces the light source 30 and a bottom side 28B that generally faces the energy harvester 60.

Figure 5:
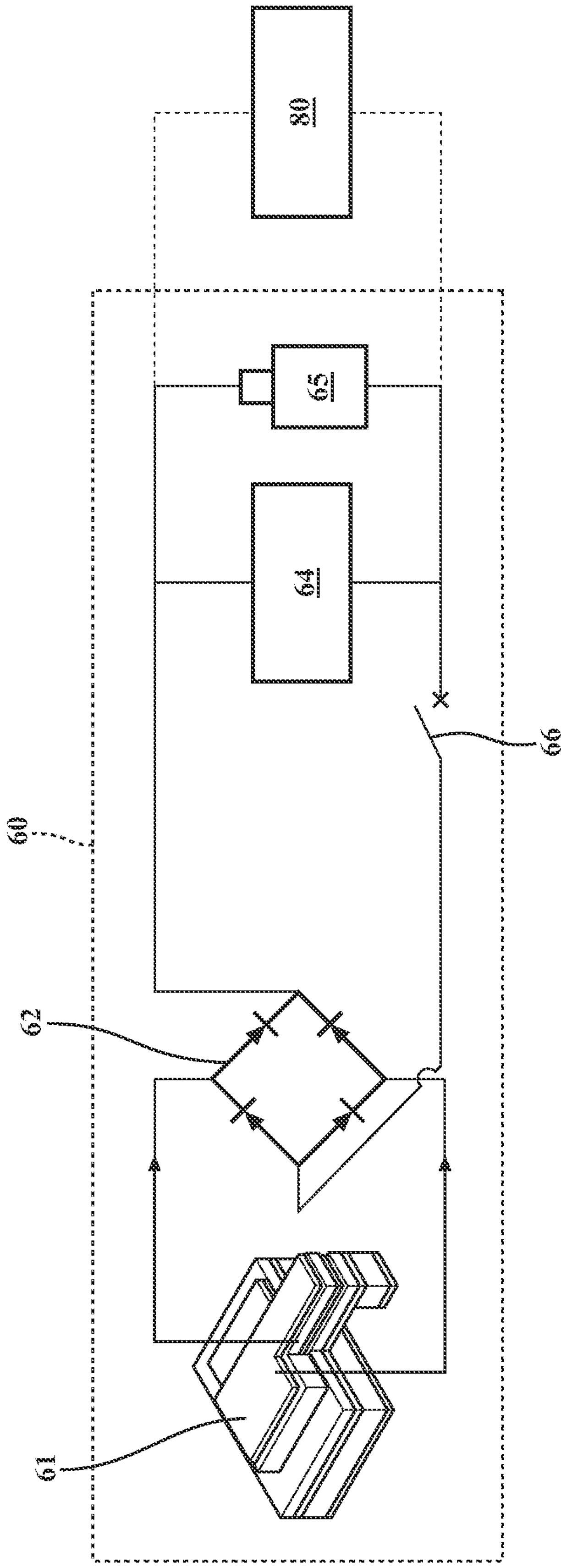
FIG. 5 illustrates one example of an energy harvester that may be utilized with the light-based sound generation and sound harvesting system of FIG. 1

As mentioned earlier, sound waves 50 generated by the sound generation layer(s) 20 are directed towards an energy harvester 60, which can convert the sound waves 50 into an electrical current which can then be used to charge an energy storage device. FIG. 5 illustrates one example of the energy harvester 60. Here, the energy harvester 60 includes a piezoelectric sensor 61. The piezoelectric sensor 61 is a device that can convert the sound wave 50 to a current. Moreover, the piezoelectric sensor 61 utilizes piezoelectric crystals placed between conductive plates. Mechanical pressure, caused by the sound waves 50, causes the movement of the piezoelectric crystals, which forces the electric charges within the piezoelectric crystals to fall out of balance. Excess negative and positive charges appear on opposite sides of the crystal face, which are collected by the conductive plates, causing the creation of an electrical current.

The electrical current may then be provided to a rectifier 62, which converts the current received from the piezoelectric sensor 61 from AC to DC. The DC can then be used to charge a battery 65 or another type of energy storage device. A regulator 64 can also be used to control the flow of current to and from the battery 65. The energy harvester 60 can also include a switch 66 to electrically separate the battery 65 from the rectifier 62. The battery 65 can be connected to an electrical load 80. The electrical load 80 can be any type of electrical load and may be in the form of an electrical device. In one particular example, the electrical load 80 may be in the form of an implantable device, such as a cardiac monitor.

Figure 6:
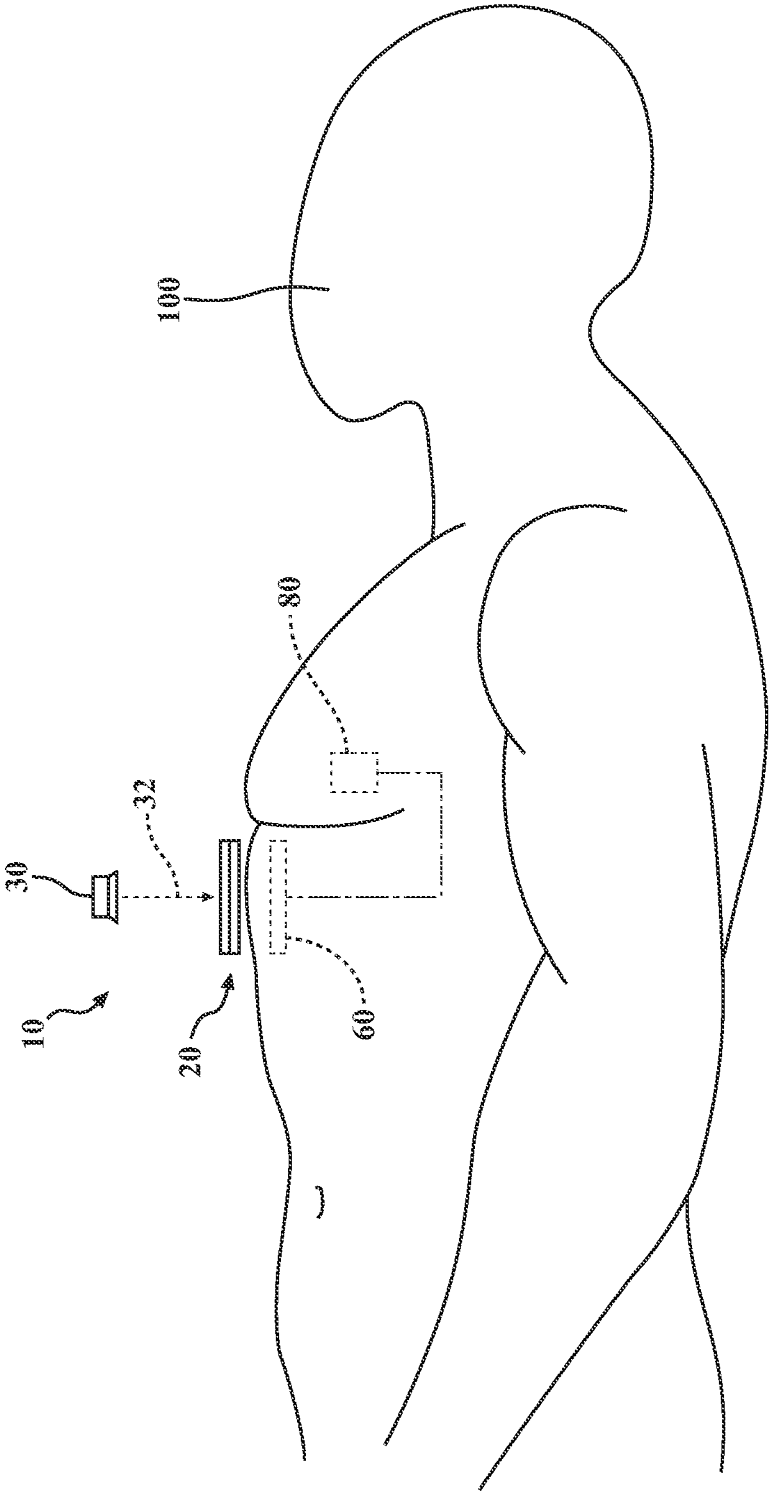
FIG. 6 illustrates one example of the light-based sound generation and sound harvesting system of FIG. 1 being utilized to charge an implanted medical device.

FIG. 6 illustrates an example wherein the electrical load 80 is in the form of an implantable device implanted within a human 100. It should be understood that the electrical load 80 can take a number of different forms and may be implanted into other mammals, and it is not limited to just humans or even limited to mammals. The implantable device is a cardiac monitor that may perform continuous or intermittent monitoring of heart activity to assess the patient's condition relative to their cardiac rhythm.

As shown, the electrical load 80, being an implantable device such as a cardiac monitor, may utilize a battery, such as the battery 65 of the energy harvester, to provide power to the electrical load 80. When the charge of the battery 65 is such that the battery 65 needs to be recharged, the light-based sound generation and sound harvesting system 10 can be utilized to recharge the battery. As explained earlier, the light source 30 outputs modulated light 32, which is received by the sound generation layer(s) 20, which produces sound waves 50 that are received by the energy harvester 60. The sound waves 50 are converted to a current by the energy harvester 60, which can then be stored within the battery 65.

As such, the light-based sound generation and sound harvesting system 10 can recharge energy storage devices, such as batteries, that are not directly or easily accessible. The light-based sound generation and sound harvesting system 10 can recharge energy storage devices without requiring a surgical procedure and without using magnetic fields, which may impact the performance of the electrical device requiring charging.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations.

The following includes definitions of selected terms employed herein. The definitions include various examples and/or forms of components that fall within the scope of a term and that may be used for various implementations. The examples are not intended to be limiting. Both singular and plural forms of terms may be within the definitions.

References to "one embodiment." "an embodiment." "one example." "an example," and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

The term "substantially similar," "substantially equal," and the like, when used to compare one or more physical properties, may indicate a variance of up to 20% unless otherwise specified.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . ." as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A system comprising:

a light source configured to output a modulated light signal at a frequency, the light source comprising an intensity modulator controllable by an electrical signal to vary an amplitude of the modulated light signal at the frequency; and an absorber layer positioned to receive the modulated light signal, the absorber layer being substantially non-transparent and configured to output a sound wave having a substantially similar frequency as the frequency of the modulated light signal when receiving the modulated light signal.

2. The system of claim 1, further comprising an impedance-matching layer disposed on the absorber layer between the light source and the absorber layer, the impedance-matching layer being substantially transparent.

3. The system of claim 2, wherein the impedance-matching layer has a substantially similar acoustic impedance as the absorber layer.

4. The system of claim 3, wherein the impedance-matching layer is thicker than the absorber layer.

5. The system of claim 1, further comprising an energy harvester configured to receive the sound wave output by the absorber layer when the absorber layer receives the modulated light signal.

6. The system of claim 5, wherein the energy harvester further comprises:

a piezoelectric sensor configured to generate a current when receiving the sound wave from the absorber layer; and an energy storage device in communication with the piezoelectric sensor, the energy storage device configured to charge when receiving the current from the piezoelectric sensor.

7. The system of claim 5, wherein the energy harvester is selectively located under the skin of a mammal.

8. The system of claim 7, wherein a first side of the absorber layer faces towards the light source and a second side of the absorber layer is configured to come into physical contact with the skin of the mammal.

9. The system of claim 1, wherein the absorber layer is made from polydimethylsiloxane (PDMS).

10. The system of claim 1, wherein the light source is one or more light-emitting diodes.

11. A system comprising:

a light source configured to output a modulated light signal at a frequency, the light source comprising an intensity modulator controllable by an electrical signal to vary an amplitude of the modulated light signal at the frequency;

an absorber layer positioned to receive the modulated light signal, the absorber layer being substantially non-transparent and configured to output a sound wave having a substantially similar frequency as the frequency of the modulated light signal when receiving the modulated light signal;

an impedance-matching layer disposed on the absorber layer between the light source and the absorber layer, the impedance-matching layer being substantially transparent, the impedance-matching layer has a substantially similar acoustic impedance as the absorber layer; and an energy harvester configured to receive the sound wave output by the absorber layer when the absorber layer receives the modulated light signal.

12. The system of claim 11, wherein the energy harvester further comprises:

a piezoelectric sensor configured to generate a current when receiving the sound wave from the absorber layer; and an energy storage device in communication with the piezoelectric sensor, the energy storage device configured to charge when receiving the current from the piezoelectric sensor.

13. The system of claim 12, wherein the energy harvester is selectively located under the skin of a mammal.

14. The system of claim 13, wherein a first side of the absorber layer faces towards the light source and a second side of the absorber layer is configured to come into physical contact with the skin of the mammal.

15. The system of claim 11, wherein the absorber layer is made from polydimethylsiloxane (PDMS).

16. The system of claim 11, wherein the light source is one or more light-emitting diodes.

17. A system comprising:

a light source configured to output a modulated light signal at a frequency, the light source comprising an intensity modulator controllable by an electrical signal to vary an amplitude of the modulated light signal at the frequency; and an absorber layer positioned to receive the modulated light signal, the absorber layer being substantially non-transparent and configured to output a sound wave having a substantially similar frequency as the frequency of the modulated light signal when receiving the modulated light signal; and an energy harvester configured to receive the sound wave output by the absorber layer when the absorber layer receives the modulated light signal and configured to be implanted within a mammal, wherein the energy harvester is configured to be electrically connected to a medical device implanted within the mammal.

18. The system of claim 17, further comprising an impedance-matching layer disposed on the absorber layer between the light source and the absorber layer, the impedance-matching layer being substantially transparent, the impedance-matching layer has a substantially similar acoustic impedance as the absorber layer.

19. The system of claim 18, wherein the energy harvester further comprises:

a piezoelectric sensor configured to generate a current when receiving the sound wave from the absorber layer; and an energy storage device in communication with the piezoelectric sensor, the energy storage device configured to charge when receiving the current from the piezoelectric sensor, the energy storage device being configured to supply power to the medical device implanted within the mammal.

20. The system of claim 17, wherein the medical device is an implantable cardiac monitor.

* * * * *